United States Patent
Su et al.

(10) Patent No.: US 7,678,655 B2
(45) Date of Patent: Mar. 16, 2010

(54) SPACER LAYER ETCH METHOD PROVIDING ENHANCED MICROELECTRONIC DEVICE PERFORMANCE

(75) Inventors: Hung Der Su, Sheh-Chung Village (TW); Ju-Wang Hsu, Taipei (TW); Yi-Chun Huang, Pingjhen (TW); Shien-Yang Wu, Hsin-Chu (TW); Yung-Shun Chen, Hsin-Chu (TW); Tung-Heng Shie, Hsinchu (TW); Yuan-Hung Chiu, Taipei (TW); Jyh-Huei Chen, Hsinchu (TW); Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 697 days.

(21) Appl. No.: 11/495,348

(22) Filed: Jul. 28, 2006

(65) Prior Publication Data

US 2008/0026518 A1 Jan. 31, 2008

(51) Int. Cl.
*H01L 21/336* (2006.01)
(52) U.S. Cl. .............. 438/305; 257/408; 257/E21.433
(58) Field of Classification Search ............... 438/305, 438/303; 257/408, E21.433
See application file for complete search history.

(56) References Cited

U.S. PATENT DOCUMENTS

| | | | |
|---|---|---|---|
| 6,200,840 B1* | 3/2001 | Chen et al. | 438/184 |
| 6,448,167 B1* | 9/2002 | Wang et al. | 438/595 |
| 6,498,067 B1* | 12/2002 | Perng et al. | 438/305 |
| 6,582,995 B2* | 6/2003 | Hsieh et al. | 438/143 |
| 2003/0027414 A1* | 2/2003 | Ko | 438/595 |
| 2003/0094662 A1* | 5/2003 | Bae et al. | 257/408 |
| 2005/0191817 A1* | 9/2005 | Komukai et al. | 438/305 |

* cited by examiner

*Primary Examiner*—Steven J Fulk
(74) *Attorney, Agent, or Firm*—Thomas, Kayden, Horstemeyer & Risley

(57) ABSTRACT

A method for forming a field effect transistor device employs a conformal spacer layer formed upon a gate electrode. The gate electrode is employed as a mask for forming a lightly doped extension region within the semiconductor substrate and the gate electrode and conformal spacer layer are employed as a mask for forming a source/drain region within the semiconductor substrate. An anisotropically etched shaped spacer material layer is formed upon the conformal spacer layer and isotropically etched to enhance exposure of the source/drain region prior to forming a silicide layer thereupon.

20 Claims, 2 Drawing Sheets

SPACER LAYER ETCH METHOD PROVIDING ENHANCED MICROELECTRONIC DEVICE PERFORMANCE

FIELD OF THE INVENTION

The invention relates generally to methods for fabricating microelectronic devices. More particularly, the invention relates to methods for fabricating microelectronic devices with enhanced performance.

BACKGROUND OF THE INVENTION

Semiconductor products are formed from semiconductor substrates within and upon which are formed semiconductor devices. The semiconductor devices are connected with patterned conductor layers that are separated by dielectric layers.

Common in the semiconductor product fabrication art is the use of field effect transistor devices as switching devices in both logic semiconductor products and memory semiconductor products. A field effect transistor device comprises a semiconductor substrate having formed thereover a gate electrode that defines a channel region within the semiconductor substrate. The channel region in turn separates a pair of source/drain regions within the semiconductor substrate.

A continuing goal within semiconductor product fabrication is the design and development of field effect transistor devices with enhanced performance. It is towards that object that the present invention is directed.

Various methods have been disclosed within the semiconductor product fabrication art for forming field effect transistor devices with enhanced performance. Included but not limiting among the methods are those disclosed within: (1) Shields et al., in U.S. Pat. No. 6,350,696 (a sequential anisotropic etching method and isotropic etching method for forming a spacer layer within a field effect transistor device); (2) Hui et al., in U.S. Pat. No. 6,461,923 (a related sequential anisotropic etch method and isotropic etch method for forming a spacer layer within a field effect transistor device); (3) Lai et al., in U.S. Pat. No. 6,492,235 (an additional related sequential anisotropic etch method and isotropic etch method for forming a spacer layer within a field effect transistor device); and (4) Riley et al., in U.S. Pat. No. 6,492,275 (an additional related sequential anisotropic etch method and isotropic etch method for forming a spacer layer within a field effect transistor device).

Desirable are additional methods for forming field effect transistor devices with enhanced performance. It is towards the foregoing object that the present invention is directed.

SUMMARY OF THE INVENTION

A first object of the invention is to provide a method for forming a field effect transistor device.

A second object of the invention is to provide a method in accord with the first object of the invention, wherein the field effect transistor device is formed with enhanced performance.

In accord with the objects of the invention, the invention provides a method for forming a field effect transistor device.

The method first provides a semiconductor substrate. A gate dielectric layer is formed upon the semiconductor substrate. A gate electrode is formed upon the gate dielectric layer. A lightly doped extension region is formed within the semiconductor substrate while employing the gate electrode as a mask. A conformal spacer layer is formed upon the gate electrode. A source/drain region is formed within the semiconductor substrate while employing the gate electrode and the conformal spacer layer as a mask. An additional spacer material layer is formed upon the conformal spacer layer. The additional spacer material layer is anisotropically etched to form an anisotropically etched shaped spacer material layer adjoining the conformal spacer layer and exposing in part the source/drain region. The anisotropically etched shaped spacer material layer is isotropically etched to further expose the source/drain region. Finally, a metal silicide layer is formed upon the further exposed source/drain region.

The invention provides a method for forming a field effect transistor device with enhanced performance.

The method realizes the foregoing object when forming a field effect transistor device by isotropically etching an anisotropically etched shaped spacer layer such as to further expose a source/drain region prior to forming a metal silicide layer upon the further exposed source/drain region. The metal silicide layer may thus be formed of larger dimension and provide enhanced performance within the field effect transistor device.

BRIEF DESCRIPTION OF THE DRAWINGS

The objects, features and advantages of the invention are understood within the context of the Description of the Preferred Embodiment, as set forth below.

The Description of the Preferred Embodiment is understood within the context of the accompanying drawings, which form a material part of this disclosure, wherein.

DESCRIPTION OF THE PREFERRED EMBODIMENT

The invention provides a method for forming a field effect transistor device with enhanced performance.

The method realizes the foregoing object when forming a field effect transistor device by isotropically etching an anisotropically etched shaped spacer layer such as to further expose a source/drain region prior to forming a metal silicide layer upon the further exposed source/drain region. The metal silicide layer may thus be formed of larger dimension and provide enhanced performance within the field effect transistor device.

FIG. 1 to FIG. 6 show a series of schematic cross-sectional diagrams illustrating the results of progressive stages of forming a field effect transistor device within a semiconductor product in accord with a preferred embodiment of the invention.

Figure 1:
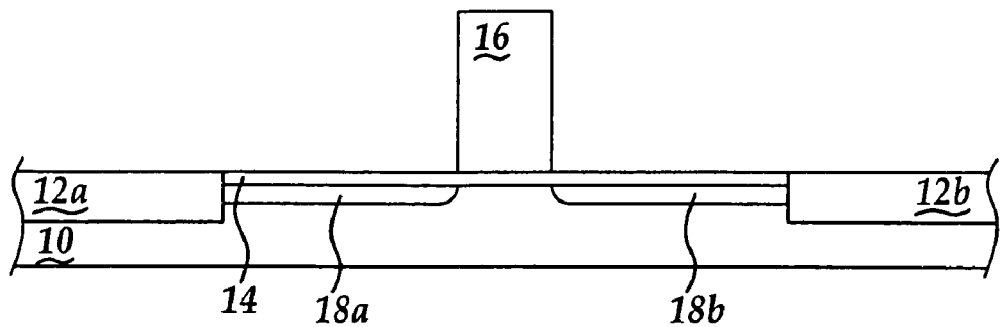
FIG. 1, FIG. 2, FIG. 3, FIG. 4, FIG. 5 and FIG. 6 show a series of schematic cross-sectional diagrams illustrating the results of progressive stages of fabricating a field effect transistor device within a semiconductor product in accord with the preferred embodiment of the invention.

FIG. 1 shows a semiconductor substrate 10 having formed therein a pair of isolation regions 12a and 12b that define an active region of the semiconductor substrate 10. The semiconductor substrate 10 may comprise semiconductor substrates including but not limited to bulk semiconductor substrates and silicon on insulator semiconductor substrates, either being formed employing semiconductor materials including but not limited to silicon semiconductor materials and silicon-germanium alloy semiconductor materials. Typically, the semiconductor substrate 10 is a (100) silicon semiconductor substrate. The pair of isolation regions 12a and 12b is conventional and may be formed as isolation regions including but not limited to local oxidation of silicon isolation regions and shallow trench isolation regions.

FIG. 1 also shows a gate dielectric layer 14 formed upon the active region of the semiconductor substrate 10 and a gate electrode 16 formed thereupon. The gate dielectric layer 14 may be formed employing methods and materials as are conventional in the semiconductor product fabrication art. Typically, the gate dielectric layer 14 is formed of silicon oxide or silicon oxynitride material formed to a thickness of from about 10 to about 100 angstroms. The gate electrode 16 is typically formed of a doped polysilicon material (i.e., from about 1E18 to about 1E20 dopant atoms per cubic centimeter), formed to a thickness of from about 1000 to about 3000 angstroms.

Finally, FIG. 1 illustrates a pair of lightly doped extension regions 18a and 18b formed into the semiconductor substrate 10 and separated by the gate electrode 16. The pair of lightly doped extension regions 18a and 18b is formed employing an ion implantation method to provide the pair of lightly doped extension regions 18a and 18b of dopant concentration from about 1E16 to about 1E21 dopant atoms per cubic centimeter within the semiconductor substrate 10.

Figure 2:
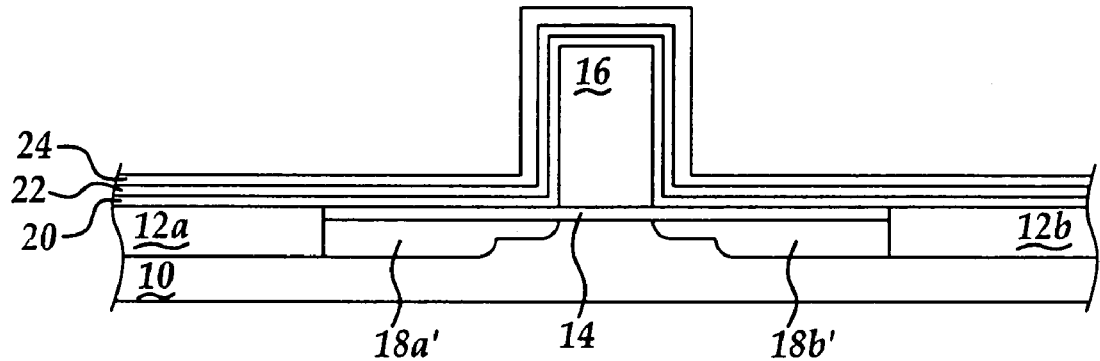

FIG. 2 first shows the formation of a series of a first blanket conformal spacer layer 20, a second blanket conformal spacer layer 22 and a third blanket conformal spacer layer 24 upon the semiconductor product of FIG. 1 and in particular including the gate electrode 16, and more particularly including the sidewalls of the gate electrode 16. Although each of the first blanket conformal spacer layer 20, the second blanket conformal spacer layer 22 and the third blanket conformal spacer layer 24 may be formed of materials including but not limited to dielectric materials, semiconductor materials and conductor materials, each of the first blanket conformal spacer layer 20, the second blanket conformal spacer layer 22 and the third blanket conformal spacer layer 24 is typically formed of a dielectric material. Typically, the first blanket conformal spacer layer 20 is formed of a silicon oxide dielectric material formed to a thickness of from about 100 to about 250 angstroms, the second blanket conformal spacer layer 22 is formed of a silicon nitride material formed to a thickness of from about 100 to about 250 angstroms and the third blanket conformal spacer layer 24 is formed of a silicon oxide material formed to a thickness of from about 100 to about 250 angstroms. In an aggregate, the first blanket conformal spacer layer 20, the second blanket conformal spacer layer 22 and the third blanket conformal spacer layer 24 form a laminated single blanket conformal spacer layer (of thickness from about 300 to about 750 angstroms) which in conjunction with the gate electrode 16 serves as a mask layer for implanting a pair of source/drain regions 18a' and 18b' into the semiconductor substrate 10. The pair of source/drain regions 18a' and 18b' incorporates the pair of lightly doped extension regions 18a and 18b as illustrated in FIG. 1. The pair of source/drain regions 18a' and 18b' is formed with a dopant concentration of from about 1E16 to about 1E18 dopant atoms per cubic centimeter.

Figure 3:
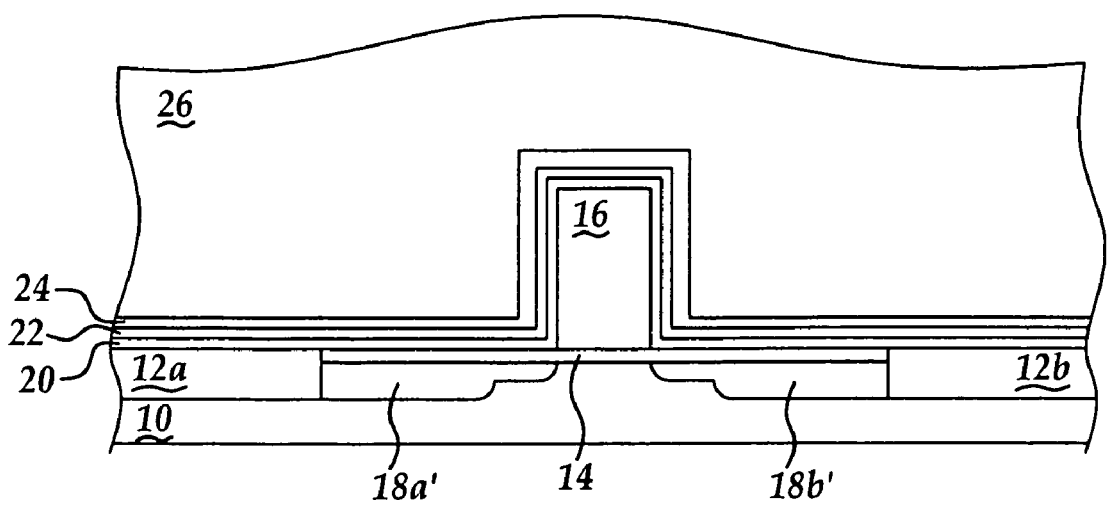

FIG. 3 shows a blanket fourth spacer material layer 26 formed upon the semiconductor product of FIG. 2.

The blanket fourth spacer material layer 26 is typically formed of a silicon nitride material, formed to a thickness of from about 4000 to about 8000 angstroms.

Figure 4:
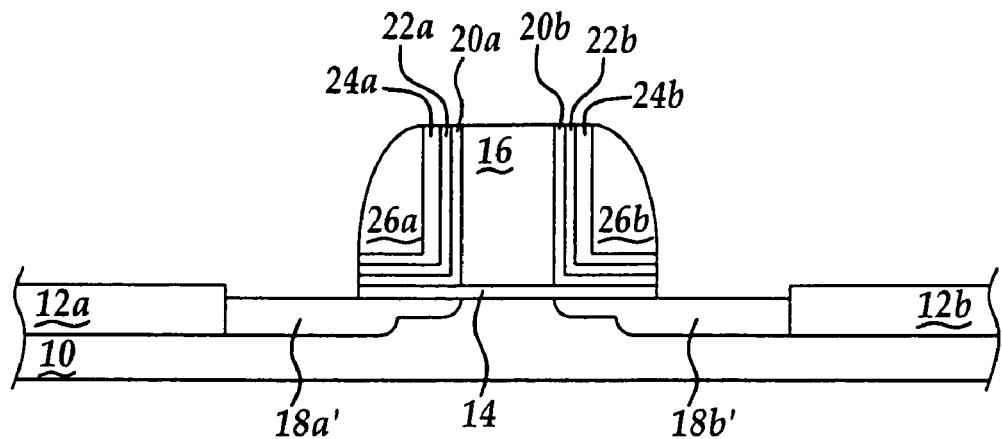

FIG. 4 shows the results of anisotropically etching the blanket fourth spacer material layer 26, the blanket third spacer material layer 24, the blanket second spacer material layer 22 and the blanket first spacer material layer 20 to form a corresponding pair of patterned fourth anisotropically etched shaped spacer layers 26a and 26b nested within a pair of patterned third conformal spacer layers 24a and 24b, patterned second conformal spacer layers 22a and 22b and patterned first conformal spacer layers 20a and 20b. The pair of patterned third conformal spacer layers 24a and 24b, the pair of patterned second conformal spacer layers 22a and 22b and the pair of patterned first conformal spacer layers 20a and 20b form in an aggregate a pair of L shaped spacers. The anisotropic etching may be effected employing plasma etch methods as are conventional in the semiconductor product fabrication art. The plasma etch methods will typically employ a fluorine containing etchant gas composition. As is illustrated in FIG. 4, the anisotropic etching exposes portions of the pair of source/drain regions 18a' and 18b', and the gate electrode 16.

Figure 5:
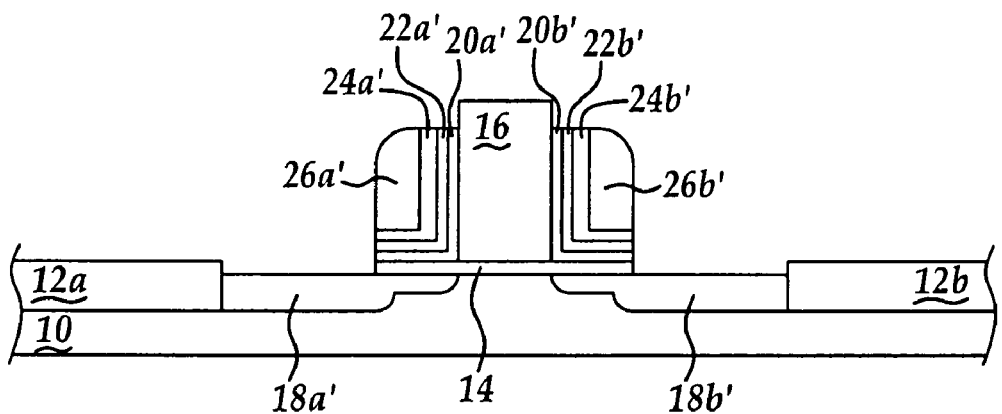

FIG. 5 shows the results of isotropically etching the anisotropically etched shaped patterned fourth spacer layers 26a and 26b, the patterned third conformal spacer layers 24a and 24b, the patterned second conformal spacer layers 22a and 22b and the pair of patterned first conformal spacer layers 20a and 20b to form a series of isotropically etched anisotropically etched shaped patterned fourth spacer layers 26a' and 26b', a pair of isotropically etched patterned third conformal spacer layers 24a' and 24b', a pair of isotropically etched patterned second conformal spacer layers 22a' and 22b' and a pair of isotropically etched patterned first conformal spacer layers 20a' and 20b'.

The isotropic etching may be undertaken employing an isotropic etchant as is otherwise conventional in the semiconductor product fabrication art. Typically, the isotropic etchant comprises a hydrofluoric acid containing material for etching silicon oxide materials and a phosphoric acid containing material for etching silicon nitride materials.

As is illustrated in FIG. 5, the isotropic etching of the foregoing spacer layers further exposes the pair of source/drain regions 18a' and 18b' and the gate electrode 16, typically by an etch-back distance of from about 500 to about 2000 angstroms.

Figure 6:
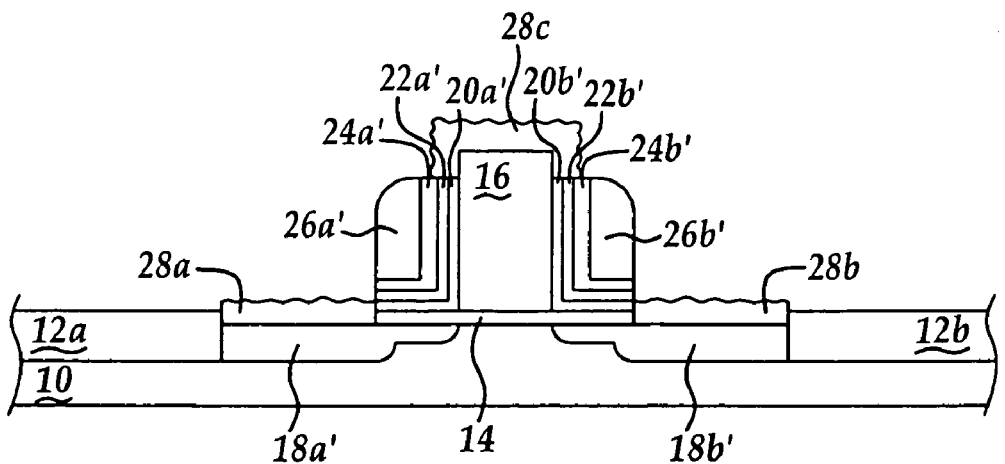

FIG. 6 illustrates a pair of metal silicide layers 28a and 28b formed upon exposed portions of the pair of source/drain regions 18a' and 18b', and a metal silicide layer 28c formed upon exposed portions of the gate electrode 16.

The series of metal silicide layers 28a, 28b and 28c is typically formed employing a self-aligned salicide method and is typically formed employing a metal selected from the group consisting of cobalt and nickel. Typically, the series of metal silicide layers 28a, 28b and 28c is formed to a thickness of from about 200 to about 500 angstroms.

FIG. 6 illustrates a semiconductor product having formed therein a field effect transistor device in accord with a preferred embodiment of the invention. The field effect transistor device has formed therein a series of metal silicide layers upon a pair of source/drain regions and a gate electrode. The series of metal silicide layers is formed with extended lateral coverage of the gate electrode and the pair of source/drain regions. The extended lateral coverage is effected by isotropically etching a pair of anisotropically etched shaped spacer layers nested within a pair of L shaped spacer layers. The isotropic etching provides for enhanced exposure of the pair of source/drain regions and the gate electrode.

The preferred embodiment of the invention is illustrative of the invention rather than limiting of the invention. Revisions and modifications may be made to methods, materials, structures and dimensions in accord with the preferred embodiment of the invention while still providing an embodiment of the invention, further in accord with the accompanying claims.

What is claimed is:

1. A method for forming a field effect transistor device comprising:
   providing a semiconductor substrate;
   forming upon the semiconductor substrate a gate dielectric layer in turn having formed thereupon a gate electrode;
   forming within the semiconductor substrate a lightly doped extension region while employing the gate electrode as a mask;
   forming conformally upon the gate electrode a conformal spacer layer;
   forming within the semiconductor substrate a source/drain region while employing the gate electrode and the conformal spacer layer as a mask;
   forming upon the conformal spacer layer an additional spacer material layer;
   anisotropically etching the additional spacer material layer to form an anisotropically etched shaped spacer material layer adjoining the conformal spacer layer and exposing in part the source/drain region;
   isotropically etching the anisotropically etched shaped spacer material layer to further expose the source/drain region, wherein at least part of an upper sidewall of the gate electrode is exposed; and
   forming upon the further exposed source/drain region a silicide layer.

2. The method of claim 1 wherein semiconductor substrate is a bulk semiconductor substrate.

3. The method of claim 1 wherein the semiconductor substrate is a silicon on insulator semiconductor substrate.

4. The method of claim 1 wherein the conformal spacer layer is formed to a thickness of from about 300 to about 750 angstroms.

5. The method of claim 1 wherein the additional spacer material layer is formed to a thickness of from about 4000 to about 8000 angstroms.

6. The method of claim 1 wherein the anisotropically etched shaped spacer material layer is etched back for a distance of from about 500 to about 2000 angstroms.

7. The method of claim 1 wherein the silicide layer is formed employing a salicide method.

8. A method for forming a field effect transistor device comprising:
   providing a semiconductor substrate;
   forming upon the semiconductor substrate a gate dielectric layer in turn having formed thereupon a gate electrode;
   forming within the semiconductor substrate a lightly doped extension region while employing the gate electrode as a mask;
   forming conformally upon the gate electrode a conformal spacer layer;
   forming within the semiconductor substrate a source/drain region while employing the gate electrode and the conformal spacer layer as a mask;
   forming upon the conformal spacer layer an additional spacer material layer;
   anisotropically etching the additional spacer material layer to form an anisotropically etched shaped spacer material layer adjoining the conformal spacer layer and exposing in part the source/drain region and the gate electrode;
   isotropically etching the anisotropically etched shaped spacer material layer to further expose the source/drain region and the gate electrode, wherein at least part of an upper sidewall of the gate electrode is exposed; and
   forming upon the further exposed source/drain region and gate electrode a pair of silicide layers.

9. The method of claim 8 wherein semiconductor substrate is a bulk semiconductor substrate.

10. The method of claim 8 wherein the semiconductor substrate is a silicon on insulator semiconductor substrate.

11. The method of claim 8 wherein the conformal spacer layer is formed to a thickness of from about 300 to about 750 angstroms.

12. The method of claim 8 wherein the additional spacer material layer is formed to a thickness of from about 4000 to about 8000 angstroms.

13. The method of claim 8 wherein the anisotropically etched shaped spacer material layer is etched back for a distance of from about 500 to about 2000 angstroms.

14. The method of claim 8 wherein the silicide layer is formed employing a salicide method.

15. A method for forming a field effect transistor device comprising:
   providing a semiconductor substrate;
   forming upon the semiconductor substrate a gate dielectric layer in turn having formed thereupon a gate electrode;
   forming within the semiconductor substrate a lightly doped extension region while employing the gate electrode as a mask;
   forming conformally upon the gate electrode a multi-layer conformal spacer layer;
   forming within the semiconductor substrate a source/drain region while employing the gate electrode and the conformal spacer layer as a mask;
   forming upon the conformal spacer layer an additional spacer material layer;
   anisotropically etching the additional spacer material layer to form an anisotropically etched shaped spacer material layer adjoining the conformal spacer layer and exposing in part the source/drain region;
   isotropically etching the anisotropically etched shaped spacer material layer to further expose the source/drain region, wherein at least part of an upper sidewall of the gate electrode is exposed; and
   forming upon the further exposed source/drain region a silicide layer.

16. The method of claim 15 wherein semiconductor substrate is a bulk semiconductor substrate.

17. The method of claim 15 wherein the semiconductor substrate is a silicon on insulator semiconductor substrate.

18. The method of claim 15 wherein the conformal spacer layer is formed to a thickness of from about 300 to about 750 angstroms.

19. The method of claim 15 wherein the additional spacer material layer is formed to a thickness of from about 4000 to about 8000 angstroms.

20. The method of claim 15 wherein the anisotropically etched shaped spacer material layer is etched back for a distance of from about 500 to about 2000 angstroms.

* * * * *